(12) United States Patent
Ueno et al.

(10) Patent No.: US 9,981,361 B2
(45) Date of Patent: May 29, 2018

(54) APPARATUS FOR DRESSING URETHANE FOAM PAD FOR USE IN POLISHING

(71) Applicant: SHIN-ETSU HANDOTAI CO., LTD., Tokyo (JP)

(72) Inventors: Junichi Ueno, Shirakawa (JP); Michito Sato, Nishigo-mura (JP); Kaoru Ishii, Shirakawa (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 144 days.

(21) Appl. No.: 14/917,105

(22) PCT Filed: Sep. 22, 2014

(86) PCT No.: PCT/JP2014/004833
§ 371 (c)(1),
(2) Date: Mar. 7, 2016

(87) PCT Pub. No.: WO2015/056405
PCT Pub. Date: Apr. 23, 2015

(65) Prior Publication Data
US 2016/0214230 A1    Jul. 28, 2016

(30) Foreign Application Priority Data
Oct. 17, 2013  (JP) ................ 2013-216738

(51) Int. Cl.
*B24B 53/00* (2006.01)
*B24B 53/017* (2012.01)
*H01L 21/02* (2006.01)

(52) U.S. Cl.
CPC ...... *B24B 53/017* (2013.01); *H01L 21/02024* (2013.01)

(58) Field of Classification Search
CPC ....... B24B 53/017; B24B 53/12; B24B 37/04; B24B 57/02; B24B 37/042; H01L 21/02024

(Continued)

(56) References Cited

U.S. PATENT DOCUMENTS 4,908,046 A * 3/1990 Wiand ............... B24D 3/06
                                          51/293
5,271,547 A * 12/1993 Carlson ............ B23K 35/302
                                          228/122.1

(Continued)

FOREIGN PATENT DOCUMENTS

CN    101232968 A    7/2008
CN    102049737 A    5/2011

(Continued)

OTHER PUBLICATIONS

Dec. 2, 2016 Office Action issued in Chinese Patent Application No. 201480049857.0.

(Continued)

*Primary Examiner* — George Nguyen
(74) *Attorney, Agent, or Firm* — Oliff PLC

(57) ABSTRACT

A dressing apparatus for dressing a urethane foam pad, for use in polishing, by bringing diamond abrasive grains into sliding contact with the urethane foam pad, includes a support for holding the grains. The grains have multiple grit sizes, and include a high-grit diamond abrasive grain with a grit size of #170 or more and a low-grit diamond abrasive grain with a grit size of #140 or less. The grains are held by the support such that height positions of dressing surfaces of the grains are on the same plane. The dressing surfaces come into contact with the urethane foam pad. As a result, a dressing apparatus is capable of sufficiently roughening the surface of the urethane foam pad by one-time dressing without closing holes of the foaming part of the urethane foam pad, enabling short dressing time, long dressing interval, and inhibition of lowering of productivity.

14 Claims, 9 Drawing Sheets

(58) Field of Classification Search
USPC .................................... 451/443, 548–551
See application file for complete search history.

(56) References Cited

U.S. PATENT DOCUMENTS

| | | | | |
|---|---|---|---|---|
| 6,293,854 | B1* | 9/2001 | Kimura | B24B 53/017 |
| | | | | 451/443 |
| 6,306,025 | B1 | 10/2001 | Torii | |
| 6,322,434 | B1* | 11/2001 | Satoh | B24B 37/005 |
| | | | | 451/443 |
| 9,724,802 | B2* | 8/2017 | Sung | B24B 53/017 |
| 2004/0048557 | A1 | 3/2004 | Nabeya | |
| 2010/0248595 | A1* | 9/2010 | Dinh-Ngoc | B24B 37/04 |
| | | | | 451/56 |
| 2011/0104989 | A1* | 5/2011 | Boutaghou | B24B 37/14 |
| | | | | 451/28 |
| 2011/0275288 | A1* | 11/2011 | Sung | B24B 53/017 |
| | | | | 451/56 |
| 2012/0302146 | A1* | 11/2012 | Sung | B24B 53/017 |
| | | | | 451/443 |
| 2013/0244552 | A1* | 9/2013 | Lee | B24B 37/20 |
| | | | | 451/443 |
| 2014/0308883 | A1* | 10/2014 | Sung | B24B 53/017 |
| | | | | 451/443 |

FOREIGN PATENT DOCUMENTS

| | | | |
|---|---|---|---|
| JP | H11-868 | A | 1/1999 |
| JP | 2001-252871 | * | 9/2001 |
| JP | 2001-341061 | A | 12/2001 |
| JP | 2004-001152 | A | 1/2004 |
| JP | 2004-098214 | A | 4/2004 |
| JP | 2008-137137 | A | 6/2008 |
| JP | 2010-274407 | A | 12/2010 |
| JP | 2012-130995 | A | 7/2012 |
| TW | I228066 | B | 2/2005 |
| TW | I380878 | B | 1/2013 |
| TW | M1458275 | U1 | 8/2013 |
| WO | 2007/015911 | A1 | 2/2007 |
| WO | 2012/157006 | A1 | 11/2012 |

OTHER PUBLICATIONS

Jun. 19, 2017 Office Action issued in Taiwanese Patent Application No. 103134780.

May 17, 2017 Office Action issued in Chinese Patent Application No. 201480049857.0.

Apr. 28, 2016 International Preliminary Report on Patentability issued in International Patent Application No. PCT/JP2014/004833.

Nov. 11, 2014 Search Report issued in International Patent Application No. PCT/JP2014/004833.

* cited by examiner

US 9,981,361 B2

APPARATUS FOR DRESSING URETHANE FOAM PAD FOR USE IN POLISHING

TECHNICAL FIELD

The present invention relates to a dressing apparatus for dressing a urethane foam pad for use in polishing a wafer.

BACKGROUND ART

In polishing of wafers, a urethane foam pad has been used to improve flatness of the surfaces of the wafers. The urethane foam pad for use in polishing is subjected to initial dressing for starting up before the use, followed by periodically batch-to-batch dressing at intervals of polishing batches. Such periodical dressing of the urethane foam pad enables setting of the urethane foam pad, thereby keeping flatness quality of wafers after polishing.

A dressing apparatus having diamond abrasive grains is generally used for dressing a urethane foam pad. The dressing apparatus is configured to dress a urethane foam pad by bringing one-grit-size diamond abrasive grains which are regularly or irregularly arranged on a support into sliding contact with the urethane foam pad.

CITATION LIST

Patent Literature

Patent Document 1: Japanese Unexamined Patent publication

SUMMARY OF INVENTION

Technical Problem

A urethane foam pad having a soft resin hardness (in particular, a urethane foam pad having a shore D hardness of 30 or less) is generally dressed with a dressing apparatus having diamond abrasive grains as mentioned above, in which the diamond abrasive grains typically have one grit size selected from #60, #100, and #325. However, when the urethane foam pad is dressed with only the low-grit diamond abrasive grains having a grit size of #60 or #100, the diamond abrasive grains are strongly caught in holes of a foaming part of the pad, and the urethane resin is stretched so that the holes of the foaming part in the pad are unfavorably closed. The urethane foam pad in which the holes of the foaming part are closed fails to retain sufficient slurry for polishing process, which causes the problem of unfavorable flatness of polished wafers.

When the urethane foam pad is dressed with only the high-grit diamond abrasive grains having a high grit size of #325, although the holes of the foaming part are not closed, the surface of the foaming part of the urethane pad cannot be sufficiently roughened since the diamond abrasive grains is too fine. Accordingly, surface roughness of the urethane foam pad becomes small, flatness of wafers after polishing cannot be kept in good condition, and thus a shorter dressing interval is required. For example, when the diamond abrasive grains having a grit size of #325 are used, good flatness of wafers continuously polished cannot be achieved unless the dressing is performed every 3 batches. As a result, the number of dressing is increased, which causes the problem of lowering productivity in manufacture of wafers.

As a dressing method capable of sufficiently roughening the surface of the urethane foam pad and reducing closing of holes of the foaming part, there may be mentioned a dressing method using a dressing apparatus having diamond abrasive grains with high grit size and a dressing apparatus having diamond abrasive grains with low grit size, one time each. However, this method has poor workability and takes long time for dressing, thereby degrading productivity in manufacture of wafers.

Patent Document 1 discloses a dressing apparatus including diamond abrasive grains having different grain diameters (grit sizes), arranged on one support. However, since the support has a fixed height, height positions of dressing surfaces of the diamond abrasive grains are different each other, and thus contact amount between the polishing pad and the diamond abrasive grains varies depending on the grain diameter. In brief, there is a problem that the contact amount between the high-grit diamond abrasive grain, which has a small abrasive grain diameter, and the polishing pad is reduced, so that the high-grit diamond abrasive grain fails to function sufficiently.

The present invention was accomplished in view of the above-described problems. It is an object of the present invention to provide a dressing apparatus that is capable of sufficiently roughening the surface of a urethane foam pad by one-time dressing without closing holes of the foaming part of the urethane foam pad, thereby enabling short dressing time, long dressing interval, and inhibition of lowering of productivity in manufacture of wafers.

Solution to Problem

To achieve this object, the present invention provides a dressing apparatus for dressing a urethane foam pad, for use in polishing, by bringing diamond abrasive grains into sliding contact with the urethane foam pad, the dressing apparatus comprising a support for holding the diamond abrasive grains, wherein the diamond abrasive grains held by the support have multiple grit sizes, the diamond abrasive grains having multiple grit sizes include a high-grit diamond abrasive grain with a grit size of #170 or more and a low-grit diamond abrasive grain with a grit size of #140 or less, the diamond abrasive grains having multiple grit sizes are held by the support such that height positions of dressing surfaces of the diamond abrasive grains are on the same plane, the dressing surfaces come into contact with the urethane foam pad.

Such a dressing apparatus enables the high-grit diamond abrasive grain and the low-grit diamond abrasive grain to come into sliding contact with the urethane foam pad simultaneously, thereby sufficiently roughening the surface by one-time dressing without closing holes of the foaming part. Consequently, short dressing time and long dressing interval are possible, and the dressing can be performed without lowering productivity.

Diamond pellets to which the diamond abrasive grains having multiple grit sizes are each stuck may be held by the support, thicknesses of the diamond pellets being adjustable, whereby the height positions of the dressing surfaces of the diamond abrasive grains are on the same plane.

According to this configuration, the height positions of the dressing surfaces of the diamond abrasive grains can be easily set on the same plane by adjusting the thicknesses of the diamond pellets.

Thickness of the support may be adjustable, whereby the height positions of the dressing surfaces of the diamond abrasive grains are on the same plane.

According to this configuration, also in the case that the diamond abrasive grains are directly electrodeposited to the support, the height positions of the dressing surfaces of the diamond abrasive grains can be set on the same plane by adjusting the thickness of the support.

It is preferred that the support is a doughnut-like support separated into a plurality of segments, each of the plurality of segments holds either the high-grit diamond abrasive grain or the low-grit diamond abrasive grain, and the segment holding the high-grit diamond abrasive grain and the segment holding the low-grit diamond abrasive grain are alternately placed on the same circumference.

Such an apparatus enables more effective and uniform dressing of the urethane foam pad without lowering productivity more securely.

Furthermore, by using the inventive dressing apparatus, a urethane foam pad, for use in polishing, having a shore D hardness of 30 or less can be dressed.

Such a dressing method enables the high-grit diamond abrasive grain and the low-grit diamond abrasive grain to come into sliding contact with the urethane foam pad simultaneously, thereby efficiently and effectively dressing the soft urethane foam pad for use in polishing a wafer with high flatness.

Advantageous Effects of Invention

The inventive dressing apparatus is capable of sufficiently roughening the surface of a urethane foam pad by one-time dressing without closing holes of the foaming part of the urethane foam pad, thereby shortening the dressing time. Use of this apparatus enables the surface of the urethane foam pad after one-time dressing to have good slurry retentivity and allows long dressing interval to keep the surface roughness in appropriate condition for long time. As a result, productivity in manufacture of wafers can be significantly improved.

DESCRIPTION OF EMBODIMENTS

Hereinafter, embodiments of the present invention will be described, but the present invention is not limited to thereto.

A dressing apparatus using low-grit diamond abrasive grains (having large average grain diameter) easily makes holes of a foaming part of a urethane foam pad closed, which causes the degradation of flatness of polished wafers. Meanwhile, a dressing apparatus using high-grit diamond abrasive grains (having small average grain diameter) cannot sufficiently roughen the surface of a urethane foam pad and thus requires dressing with short dressing interval, which results in degrading of productivity.

In view of this, the present inventors conducted studies to solve such problems, and found bringing diamond abrasive grains having two or more grit sizes into sliding contact with a urethane foam pad simultaneously. Then, they repeatedly and keenly conducted studies and found that both the above problems can be solved by the configuration that includes a high-grit diamond abrasive grain with a grit size of #170 or more and a low-grit diamond abrasive grain with a grit size of #140 or less in which height positions of dressing surfaces of the diamond abrasive grains are on the same plane, thereby brought the present invention to completion.

Hereinafter, the inventive dressing apparatus will be described with reference to FIGS. 1 to 6.

Figure 1:
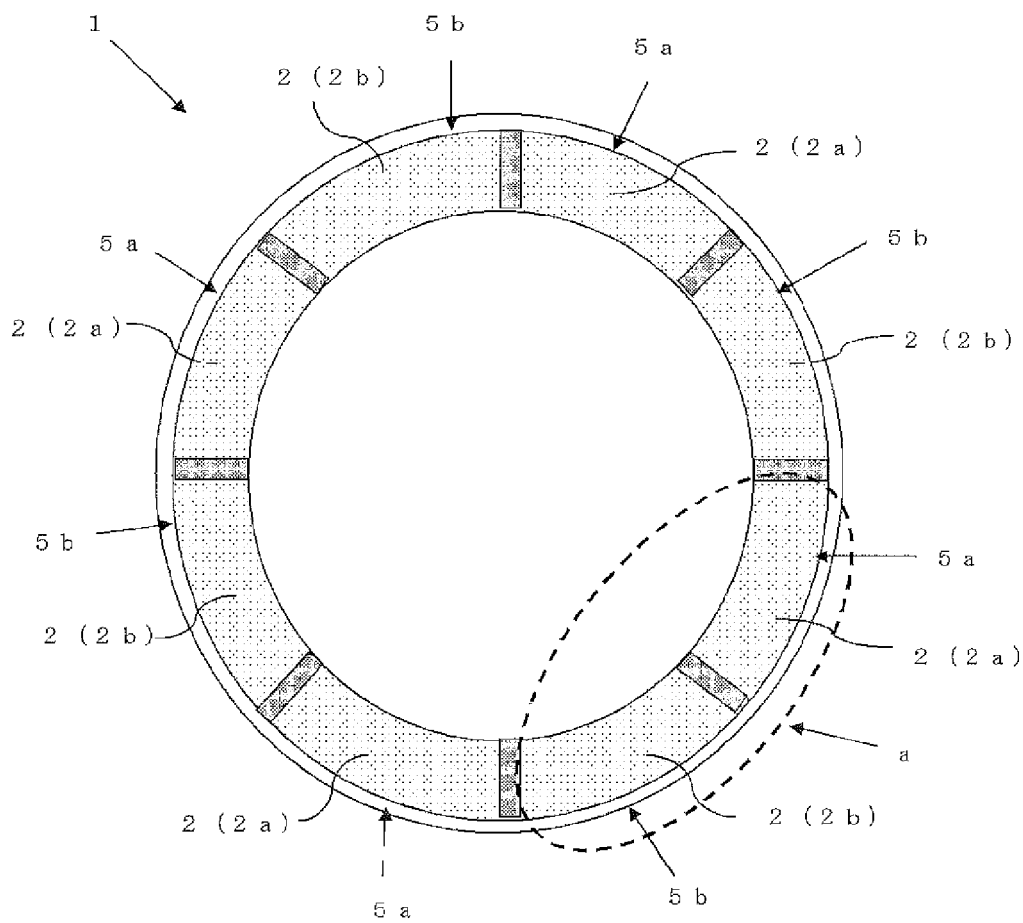
FIG. 1 is a schematic diagram showing an example of the inventive dressing apparatus.
Figure 2:
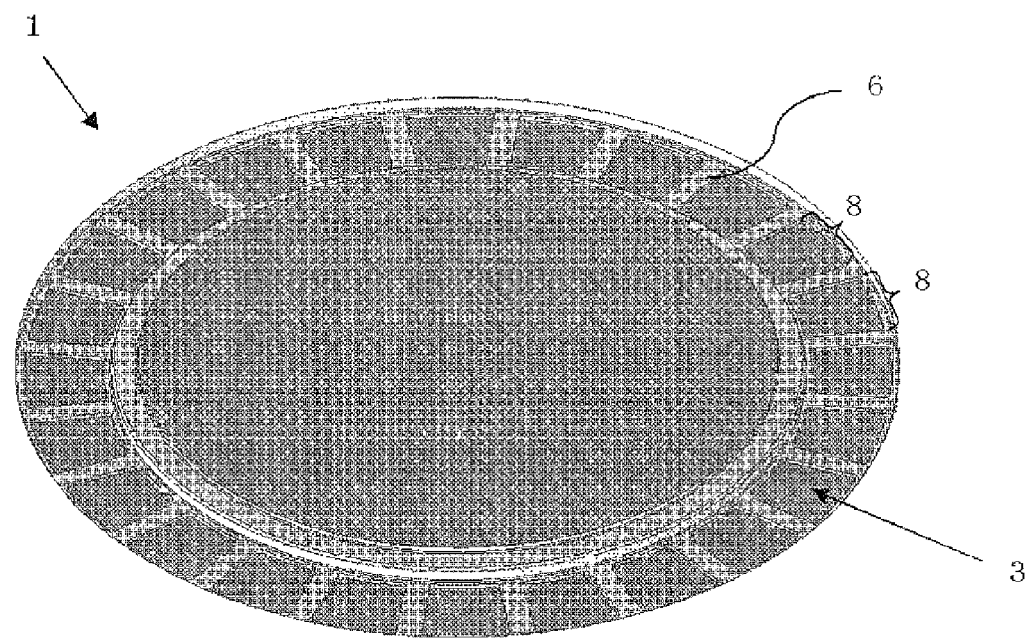
FIG. 2 is a schematic diagram showing an arrangement of the support of the inventive dressing apparatus.

As shown in FIGS. 1 and 2, a dressing apparatus 1 has a doughnut-like plate 6, a doughnut-like support 3, diamond pellets 5a, 5b to which diamond abrasive grains 2 are stuck.

The doughnut-like support 3 is attached to and held by an upper surface of the plate 6. The material of the plate 6 holding the support 3 may be a metal or a metal the surface of which is subjected to coating treatment. Illustrative examples of the usable material include stainless steel, stainless steel coated with a resin, stainless steel coated with diamond-like carbon, and stainless steel coated with titanium nitride. The coating treatment is not performed on the part which contacts with the diamond pellets and requires parallelism.

As shown in FIG. 2, the support 3 may be separated into multiple fan-shaped segments 8, and fan-shaped diamond pellets 5a, 5b may be each attached to and held by the separated segments 8.

Figure 3:
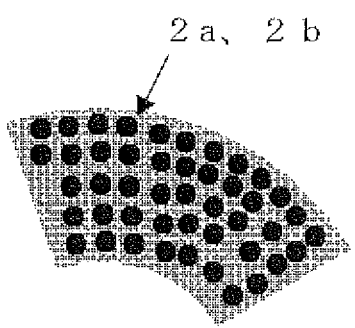
FIG. 3 is a schematic diagram showing the case where the diamond abrasive grains are regularly arranged in the inventive dressing apparatus.
Figure 4:
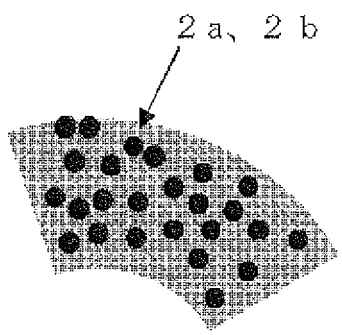
FIG. 4 is a schematic diagram showing the case where the diamond abrasive grains are irregularly arranged in the inventive dressing apparatus.

To the diamond pellets 5a are stuck high-grit diamond abrasive grains 2a. In the present invention, the high-grit diamond abrasive grain 2a indicates a diamond abrasive grain having a grit size of #170 or more. On the other hand, to the diamond pellets 5b are stuck low-grit diamond abrasive grains 2b. In the present invention, the low-grit diamond abrasive grain 2b indicates a diamond abrasive grain having a grit size of #140 or less. As an alternative to the diamond pellets, the diamond abrasive grains 2a, 2b may be directly electrodeposited to respective segments 8 of the support 3 to hold the diamond abrasive grains 2a, 2b by the support 3. The diamond abrasive grains 2a, 2b stuck on the diamond pellets 5a, 5b or electrodeposited to the support 3 may be arranged regularly as shown in FIG. 3 or irregularly as shown in FIG. 4.

Preferably, as shown in FIG. 1, the segments 8 holding the diamond pellets 5a to which the high-grit diamond abrasive grains 2a are stuck and the segments 8 holding the diamond pellets 5b to which the low-grit diamond abrasive grains 2b are stuck are alternately placed on the same circumference. Such arrangement of the segments 8 enables effective and uniform dressing of the urethane foam pad, thereby inhibiting lowering of productivity more securely.

Figure 5:
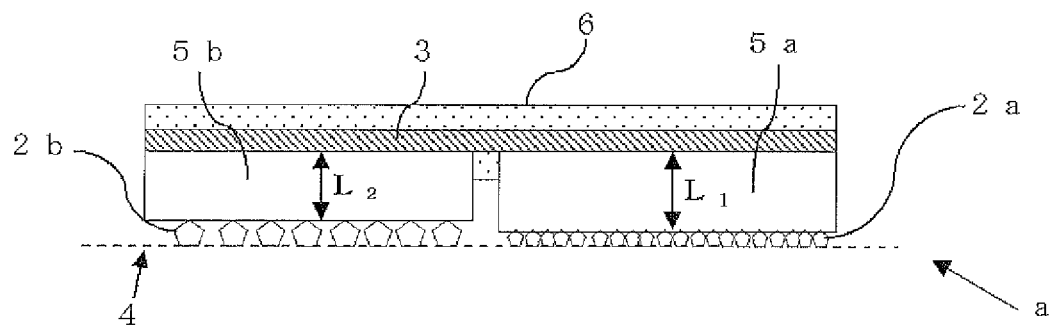
FIG. 5 is a magnified side view of a part of the inventive dressing apparatus.
Figure 6:
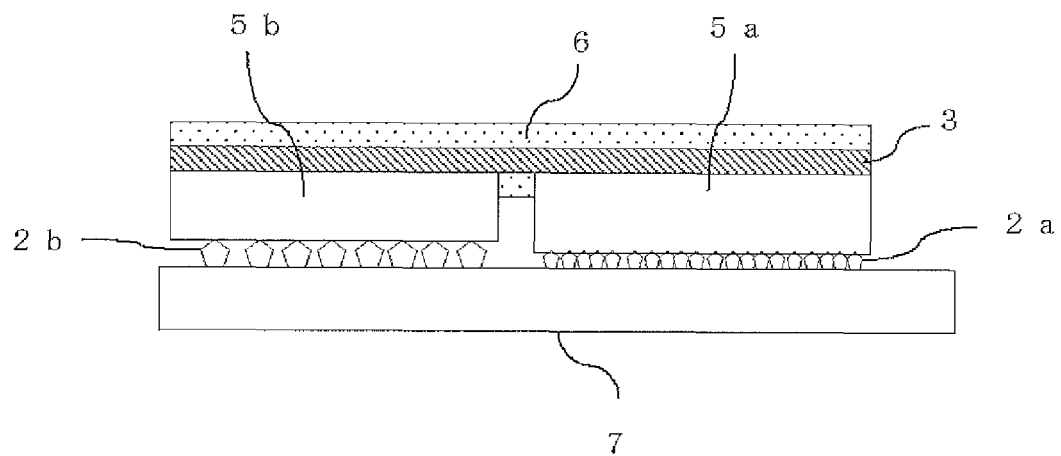
FIG. 6 is a schematic side view showing the case where the urethane foam pad is dressed with the inventive dressing apparatus.

In the present invention, as illustrated in FIG. 5 (a part shown by "a" in FIG. 1), the high-grit diamond abrasive grains 2a and the low-grit diamond abrasive grains 2b are provided such that height positions of their dressing surfaces 4 are on the same plane. More specifically, thickness $L_1$ of the diamond pellet 5*a* and thickness L$_2$ of the diamond pellet 5*b* shown in FIG. 5 are adjusted according to difference of the grit sizes of the respective diamond abrasive grains, whereby the height positions of the dressing surfaces 4 can be set on the same plane. Alternatively, height of the support 3 may be adjusted according to difference of the grit sizes of the diamond abrasive grains such that the height positions of the dressing surfaces 4 are on the same plane. As a further alternative, both the thicknesses of the diamond pellets and the height of the support may be adjusted such that the height positions are on the same plane. When the height positions of the dressing surfaces 4 are on the same plane, as shown in FIG. 6, both the high-grit diamond abrasive grains 2*a* and the low-grit diamond abrasive grains 2*b* can be brought into sliding contact with the surface of the urethane foam pad 7 simultaneously, during dressing.

According to the inventive dressing apparatus 1, the urethane foam pad 7 are stretched and the surface of the pad is roughened by scratching (specifically, SMD showing surface roughness of the pad is kept to 3 µm or more) due to the low-grit diamond abrasive grains 2*b*, and simultaneously, the resin stretched by the low-grit diamond abrasive grains 2*b* is cut and closing of holes of the foaming part can be prevented due to the high-grit diamond abrasive grains 2*a*. In addition, since the height positions of the dressing surfaces 4 of the respective diamond abrasive grains are on the same plane, not only the low-grit diamond abrasive grains 2*b* having large diameter, but also the high-grit diamond abrasive grains 2*a* having small diameter can be brought into contact with the urethane foam pad 7, sufficiently. As a result, the surface can be roughened without closing holes of the foaming part of the urethane foam pad 7, dressing interval can be made longer, and lowering of productivity can be inhibited in manufacture of wafers.

The dressing apparatus 1 described above is an exemplary case where the abrasive grains include one type of high-grit diamond abrasive grain and one type of low-grit diamond abrasive grain, in sum, diamond abrasive grains having two grit sizes are used. As will be appreciated, the present invention is not limited thereto, and diamond abrasive grains having three or more grit sizes may be used. Moreover, in the above example, the thicknesses of the diamond pellets and the height of the support are adjusted by the diamond pellets and the segments, respectively. Of course, the present invention is not limited thereto. To set the height positions of the dressing surfaces 4 on the same plane, the height of the support and the thicknesses of the diamond pellets may be adjusted by providing steps on the surfaces of the support and the diamond pellets or using arched surface.

The inventive dressing apparatus 1 as mentioned above can be used for dressing a urethane foam pad having a shore D hardness of 30 or less. Dressing can be performed by, for example, holding the dressing apparatus 1 by a disklike rotation drive mechanism and bringing the dressing apparatus 1 into sliding contact with the urethane foam pad 7 while rotating the apparatus.

Such a dressing method can sufficiently roughen the surface of the urethane foam pad without closing holes of the foaming part of the urethane foam pad since the dressing apparatus 1 includes two or more high-grit and low-grit diamond abrasive grains the dressing surfaces 4 of which are on the same plane. Accordingly, the urethane foam pad can be efficiently dressed so that wafers having good flatness can be manufactured, and productivity in manufacture of wafers can be improved. Thus, the dressing method using the inventive dressing apparatus 1 is particularly suitable for dressing a urethane foam pad having a shore D hardness of 30 or less.

EXAMPLE

Hereinafter, the present invention will be described in more detail with reference to examples and comparative examples, but the present invention is not limited thereto.

Example 1

In a single-side polishing apparatus for wafer (a single-side polishing apparatus SRED made by Fujikoshi Machinery Corp), the inventive dressing apparatus in which height positions of diamond abrasive grains having multiple grit sizes are on the same plane, as illustrated in FIG. 1, was held by a disklike rotation drive mechanism. Using this dressing apparatus, initial dressing was performed for starting up of an unused urethane foam pad attached to a turn table. After the initial dressing, the surface condition of the urethane foam pad was observed with a microscope to examine whether holes of the foaming part were closed or not. Then, wafers were single-side polished in a batch manner with the dressed urethane foam pad, and flatness of the wafer single-side polished in the tenth batch was measured.

In the initial dressing of the urethane foam pad, a high-grit diamond abrasive grain with a grit size of #200 and a low-grit diamond abrasive grain with a grit size of #100 were used as the diamond abrasive grains. The dressing condition was as follows: rotational speed of the dressing apparatus was 10 rpm; rotational speed of the turn table was 20 rpm; load was 35 mg/cm$^2$; initial dressing time was 300 seconds. As the dressing liquid, water was used.

The wafers used for single-side polishing were P-type wafers having a diameter of 300 mm and a crystal orientation of <100>. The polishing condition was as follows: polishing load was 80 to 200 g/cm$^2$; rotational speed of the turn table was 30 rpm; rotational speed of the polishing head was 30 rpm. As the polishing agent, NaOH-based colloidal silica was used.

The flatness of the wafer polished was measured with a flatness tester Nanometoro 300TT-A made by Kuroda precision industries Ltd.

Figure 7:
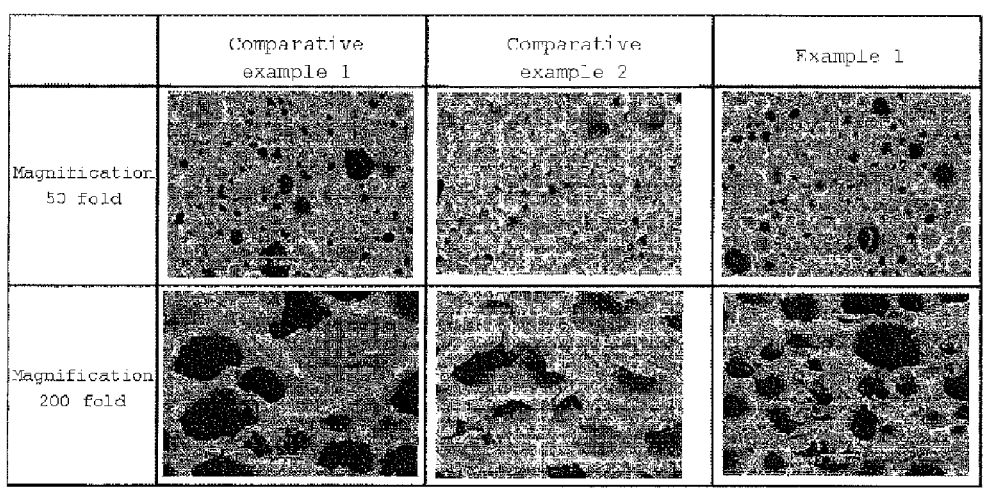
FIG. 7 is observation result of the surface condition of the urethane foam pad in example 1 and comparative examples 1 and 2.

FIG. 7 illustrates photographs showing the surface condition of the urethane foam pad just after the initial dressing. As shown in FIG. 7, holes of the foaming part were open without closing, and the surface other than the holes was sufficiently roughened.

Figure 8:
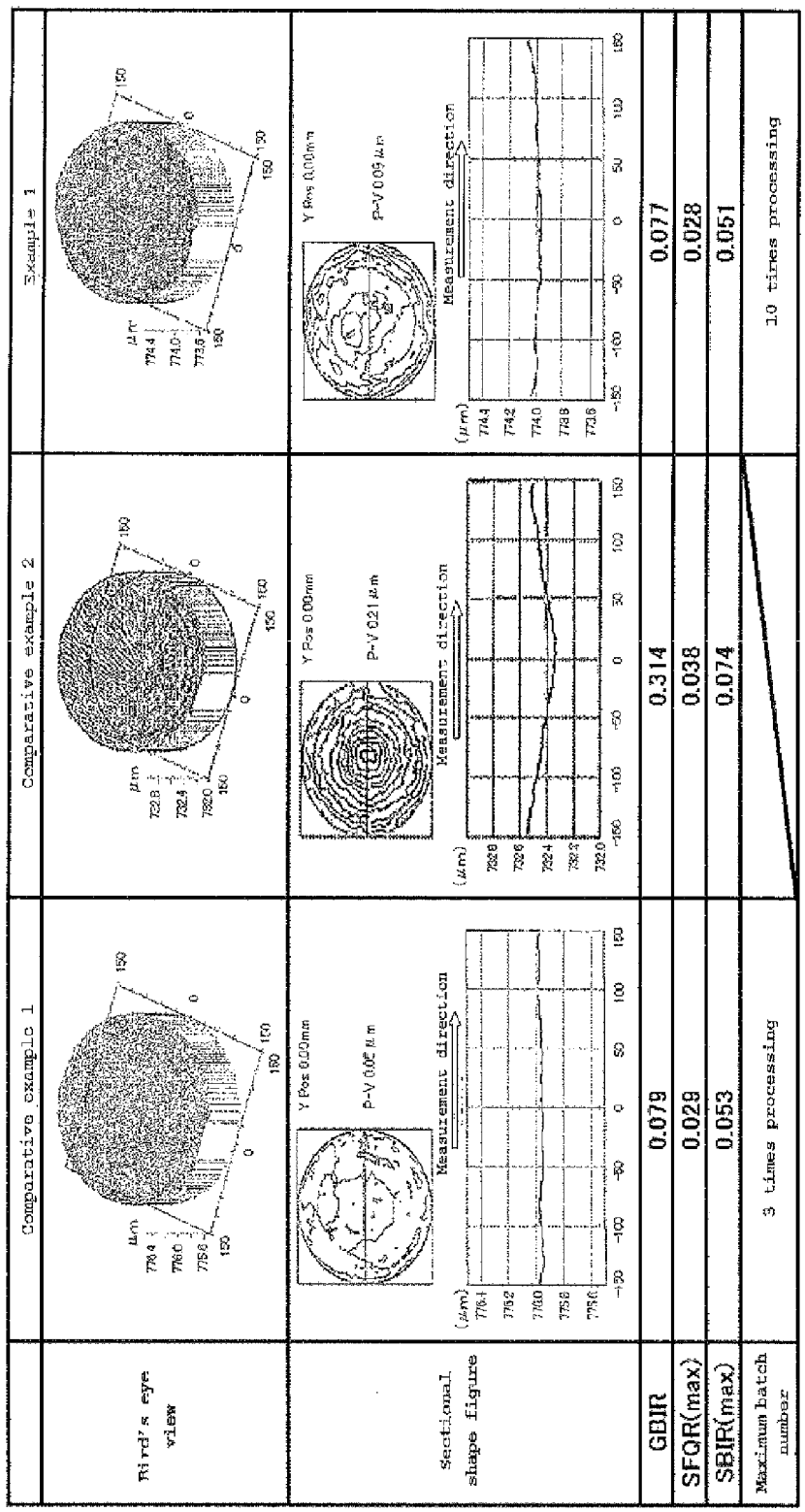
FIG. 8 is measurement result of flatness after single-side polishing in example 1 and comparative examples 1 and 2.

FIG. 8 shows measurement result of wafer flatness after single-side polishing. As shown in FIG. 8, the wafer after the tenth batch exhibited GBIR of 0.077 (µm), SFQRmax of 0.028 (µm), and SBIRmax of 0.051 (µm), which were smaller than comparative example 2 described later, and thus a wafer having higher flatness could be obtained, compared with comparative example 2. This result indicates that even when the dressing interval was set at 10 batches, which are longer than comparative example 1 described later, a wafer having higher flatness can be obtained, compared with comparative example 2. Table 1 shows inspection results of whether holes of the foaming part were closed or not and the maximum number of batch to obtain a wafer having good flatness.

In addition, dressing was performed under the same condition as above except that a high-grit diamond abrasive grain with a grit size of #170 and a low-grit diamond abrasive grain with a grit size of #60 were used as the diamond abrasive grains in the initial dressing. Then, the surface condition of the urethane foam pad was observed with a microscope, consequently finding that holes of the foaming part were not closed and the surface was sufficiently roughened. Also in this case, a wafer having high flatness could be obtained even after continuous 10 polishing batches. Similarly, dressing was performed under the same condition as above except that a high-grit diamond abrasive grain with a grit size of #170 and a low-grit diamond abrasive grain with a grit size of #140 were used as the diamond abrasive grains in the initial dressing. Also in this case, holes of the foaming part were not closed, the surface was sufficiently roughened, and a wafer having high flatness could be obtained even after continuous 10 polishing batches. From these results, it could be understood that when the inventive dressing apparatus was employed, productivity in manufacture of wafers could be improved.

Comparative Example 1

Initial dressing of a urethane foam pad, polishing of a wafer, and flatness measurement were performed under the same condition as in example 1 except that only a diamond abrasive grain having a grit size of #325 was used, and the flatness measurement was performed on a wafer single-side polished in the third batch.

Consequently, as shown in FIG. 7 and Table 1, although holes of the foaming part were not closed but open, the surface other than the holes was not sufficiently roughened. Therefore, as shown in FIG. 8, although the wafer polished in the third batch from dressing exhibited good values of GBIR of 0.079 (μm), SFQRmax of 0.029 (μm), and SBIRmax of 0.053 (μm), when polishing batch was continuously repeated over 3 times, a wafer having good flatness could not be obtained. Thus, comparative example 1 exhibited smaller maximum batch number to obtain a wafer having good flatness, and then requires a dressing interval every 3 batches or less, resulting in degradation of productivity in manufacture of wafers, compared with example 1.

Similarly, initial dressing of a urethane foam pad, polishing of a wafer, and flatness measurement were performed except for changing the grit size of the diamond abrasive grain to #170, #200, or #230. Consequently, as shown in Table 1, when the diamond abrasive grain having a grit size of #230 was used alone, the maximum batch number to obtain a wafer having good flatness was small value of 3 batches, like the case where the diamond abrasive grain having a grit size of #325 was used alone. When the diamond abrasive grain having a grit size of #170 or #200 was used alone, the maximum batch number to obtain a wafer having good flatness was slightly improved as 5 batches, but this number was half of that in example 1.

Comparative Example 2

Initial dressing of a urethane foam pad, polishing of a wafer, and flatness measurement were performed under the same condition as in example 1 except that only a diamond abrasive grain having a grit size of #100 was used and the flatness measurement was performed on a wafer single-side polished in the first batch.

Consequently, as shown in FIG. 7 and Table 1, holes of the foaming part were closed. Therefore, as shown in FIG. 8, the wafer polished in the first batch just after dressing exhibited GBIR of 0.314 (μm), SFQRmax of 0.038 (μm), and SBIRmax of 0.074 (μm), which were remarkably worse than example 1. Moreover, the polished wafer had concave shape, and the wafer shape was degraded. It was revealed that the urethane foam pad having such a surface condition fails to obtain a wafer having good flatness, unlike example 1.

Similarly, initial dressing of a urethane foam pad, polishing of a wafer, and flatness measurement were performed in the same manner except for changing the grit size of the diamond abrasive grain to #60, #80, #120, or #140. Consequently, as shown in Table 1, holes of the foaming part were closed and a wafer having good flatness could not be obtained in all cases.

Comparative Example 3

Initial dressing of a urethane foam pad, polishing of a wafer, and flatness measurement were performed under the same condition as in example 1 except that two low-grit diamond abrasive grains having grit sizes of #60 and #140 were used in combination and the flatness measurement was performed on a wafer single-side polished in the first batch.

Consequently, as shown in Table 1, holes of the foaming part were closed, and a wafer having good flatness could not be obtained, unlike example 1.

Example 2

In addition to the same condition as in example 1, initial dressing and batch-to-batch dressing every 10 polishing bathes were performed with the inventive dressing apparatus to measure GBIR of a wafer after single-side polishing. In example 2, the time for batch-to-batch dressing was 180 seconds, and a flatness tester WaferSight2 made by KLA-Tencor Co., Ltd was used for the flatness measurement.

Figure 9:
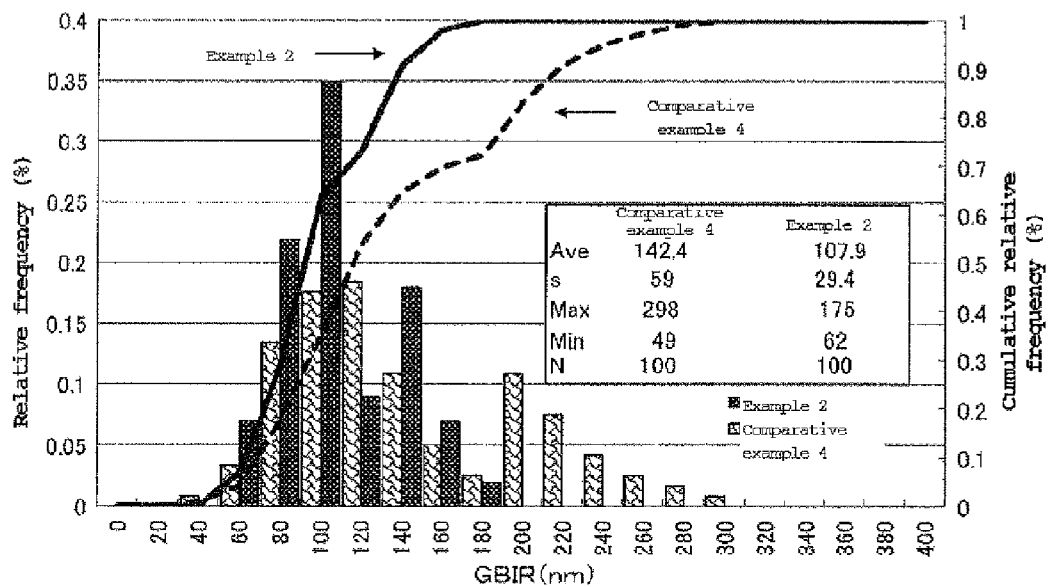
FIG. 9 is measurement result of GBIR in example 2 and comparative example 3.

Consequently, as shown in FIG. 9, average value of GBIR (Ave in FIG. 9) was 107.9 (nm), standard deviation (s in FIG. 9) was 29.4 (nm). As such, it could be understood that an amount of a change between the flatness of the wafer polished in the first batch after dressing and the flatness of the wafer polished in the tenth batch after dressing was small. Thus, it was revealed that also in this case, a wafer having high flatness could be obtained even when the dressing was performed at a long interval every 10 polishing batches.

Comparative Example 4

Initial dressing and batch-to-batch dressing of a urethane foam pad, polishing of a wafer, and flatness measurement were performed under the same condition as in example 2 except that a diamond abrasive grain having a grit size of #325 was used alone.

Consequently, as shown in FIG. 9, average value of GBIR (Ave in FIG. 9) was 142.4 (nm), and standard deviation (s in FIG. 9) was 59.0 (nm). As such, it could be understood that an amount of a change between the flatness of the wafer polished in the first batch after dressing and the flatness of the wafer polished in the tenth batch after dressing was large. Thus, it was revealed that in this case, a wafer having high flatness could be obtained only in several batches after dressing when the dressing was performed at a long interval every 10 polishing batches.

The results of examples and comparative examples are summarized in Table 1.

TABLE 1

| | Grit size | Whether holes of foaming part are closed | Maximum batch number |
|---|---|---|---|
| Comparative example 2 | #60 | closed | |
| | #80 | closed | |
| | #100 | closed | |
| | #120 | closed | |
| | #140 | closed | |
| Comparative example 1 | #170 | open | 5 |
| | #200 | open | 5 |
| | #230 | open | 3 |
| | #325 | open | 3 |
| Comparative example 3 | #60 + #140 | closed | 10 |
| Example 1 | #140 + #170 | open | 10 |
| | #60 + #170 | open | 10 |
| | #100 + #200 | open | 10 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A dressing apparatus for dressing a urethane foam pad, for use in polishing, by bringing diamond abrasive grains into sliding contact with the urethane foam pad, the dressing apparatus comprising a support for holding the diamond abrasive grains, wherein
the diamond abrasive grains held by the support have multiple grit sizes, the diamond abrasive grains having multiple grit sizes include a high-grit diamond abrasive grain with a grit size of #170 or more and a low-grit diamond abrasive grain with a grit size of #140 or less, the diamond abrasive grains having multiple grit sizes are held by the support such that height positions of dressing surfaces of the diamond abrasive grains are on the same plane, the dressing surfaces come into contact with the urethane foam pad, and
wherein diamond pellets to which the diamond abrasive grains having multiple grit sizes are each stuck are held by the support, thicknesses of the diamond pellets being adjustable, whereby the height positions of the dressing surfaces of the diamond abrasive grains are on the same plane.

2. A dressing apparatus for dressing a urethane foam pad, for use in polishing, by bringing diamond abrasive grains into sliding contact with the urethane foam pad, the dressing apparatus comprising a support for holding the diamond abrasive grains, wherein
the diamond abrasive grains held by the support have multiple grit sizes, the diamond abrasive grains having multiple grit sizes include a high-grit diamond abrasive grain with a grit size of #170 or more and a low-grit diamond abrasive grain with a grit size of #140 or less, the diamond abrasive grains having multiple grit sizes are held by the support such that height positions of dressing surfaces of the diamond abrasive grains are on the same plane, the dressing surfaces come into contact with the urethane foam pad, and
wherein thickness of the support is adjustable, whereby the height positions of the dressing surfaces of the diamond abrasive grains are on the same plane.

3. The dressing apparatus according to claim 1, wherein thickness of the support is adjustable, whereby the height positions of the dressing surfaces of the diamond abrasive grains are on the same plane.

4. A dressing apparatus for dressing a urethane foam pad, for use in polishing, by bringing diamond abrasive grains into sliding contact with the urethane foam pad, the dressing apparatus comprising a support for holding the diamond abrasive grains, wherein
the diamond abrasive grains held by the support have multiple grit sizes, the diamond abrasive grains having multiple grit sizes include a high-grit diamond abrasive grain with a grit size of #170 or more and a low-grit diamond abrasive grain with a grit size of #140 or less, the diamond abrasive grains having multiple grit sizes are held by the support such that height positions of dressing surfaces of the diamond abrasive grains are on the same plane, the dressing surfaces come into contact with the urethane foam pad, and
wherein the support is a doughnut-like support separated into a plurality of segments, each of the plurality of segments holds either the high-grit diamond abrasive grain or the low-grit diamond abrasive grain, and the segment holding the high-grit diamond abrasive grain and the segment holding the low-grit diamond abrasive grain are alternately placed on the same circumference.

5. The dressing apparatus according to claim 1, wherein the support is a doughnut-like support separated into a plurality of segments, each of the plurality of segments holds either the high-grit diamond abrasive grain or the low-grit diamond abrasive grain, and the segment holding the high-grit diamond abrasive grain and the segment holding the low-grit diamond abrasive grain are alternately placed on the same circumference.

6. The dressing apparatus according to claim 2, wherein the support is a doughnut-like support separated into a plurality of segments, each of the plurality of segments holds either the high-grit diamond abrasive grain or the low-grit diamond abrasive grain, and the segment holding the high-grit diamond abrasive grain and the segment holding the low-grit diamond abrasive grain are alternately placed on the same circumference.

7. The dressing apparatus according to claim 3, wherein the support is a doughnut-like support separated into a plurality of segments, each of the plurality of segments holds either the high-grit diamond abrasive grain or the low-grit diamond abrasive grain, and the segment holding the high-grit diamond abrasive grain and the segment holding the low-grit diamond abrasive grain are alternately placed on the same circumference.

8. A dressing method of dressing a urethane foam pad, for use in polishing, having a shore D hardness of 30 or less by using a dressing apparatus according to claim 1.

9. A dressing method of dressing a urethane foam pad, for use in polishing, having a shore D hardness of 30 or less by using a dressing apparatus according to claim 2.

10. A dressing method of dressing a urethane foam pad, for use in polishing, having a shore D hardness of 30 or less by using a dressing apparatus according to claim 3.

11. A dressing method of dressing a urethane foam pad, for use in polishing, having a shore D hardness of 30 or less by using a dressing apparatus according to claim 4.

12. A dressing method of dressing a urethane foam pad, for use in polishing, having a shore D hardness of 30 or less by using a dressing apparatus according to claim 5.

13. A dressing method of dressing a urethane foam pad, for use in polishing, having a shore D hardness of 30 or less by using a dressing apparatus according to claim 6.

14. A dressing method of dressing a urethane foam pad, for use in polishing, having a shore D hardness of 30 or less by using a dressing apparatus according to claim 7.

\* \* \* \* \*